(12) United States Patent
Nikolaev et al.

(10) Patent No.: US 8,934,083 B2
(45) Date of Patent: Jan. 13, 2015

(54) LITHOGRAPHIC APPARATUS AND DETECTOR APPARATUS

(75) Inventors: Ivan Sergejevitsj Nikolaev, Eindhoven (NL); Martijn Wehrens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 134 days.

(21) Appl. No.: 13/260,009

(22) PCT Filed: Mar. 23, 2010

(86) PCT No.: PCT/EP2010/053742
§ 371 (c)(1),
(2), (4) Date: Dec. 12, 2011

(87) PCT Pub. No.: WO2010/124910
PCT Pub. Date: Nov. 4, 2010

(65) Prior Publication Data
US 2012/0081683 A1 Apr. 5, 2012

Related U.S. Application Data

(60) Provisional application No. 61/172,904, filed on Apr. 27, 2009.

(51) Int. Cl.
*G03B 27/42* (2006.01)
*G03F 7/20* (2006.01)
*H01L 27/146* (2006.01)

(52) U.S. Cl.
CPC ............ *G03F 7/7085* (2013.01); *G03F 7/706* (2013.01); *H01L 27/14663* (2013.01)
USPC .................. 355/53; 355/55; 355/63; 355/67; 355/77

(58) Field of Classification Search
CPC ............ G01J 1/42; G01J 9/02; G01J 9/0246; G03F 7/706; G03F 7/7085; H01L 27/14663
USPC .................... 355/53, 55, 63, 67, 77; 257/231; 977/954
See application file for complete search history.

(56) References Cited

U.S. PATENT DOCUMENTS

| 3,891,849 A | 6/1975 | Felice et al. |
| 7,193,228 B2 | 3/2007 | Bowering et al. |

(Continued)

FOREIGN PATENT DOCUMENTS

| CN | 1504831 A | 6/2004 |
| CN | 1677246 A | 10/2005 |
| EP | 1 426 824 A1 | 6/2004 |
| EP | 1 582 927 A1 | 10/2005 |
| JP | 2007-201475 A | 8/2007 |
| JP | 2007-528608 A | 10/2007 |
| JP | 2008-192987 A | 8/2008 |

OTHER PUBLICATIONS

International Search Report directed to related International Patent Application No. PCT/EP2010/053742, mailed Aug. 2, 2010, from the European Patent Office; 4 pages.
International Preliminary Report on Patentability with the Written Opinion of the International Searching Authority directed to related International Patent Application No. PCT/EP2010/053742, issued Nov. 1, 2011, from the International Bureau of WIPO; 5 pages.

*Primary Examiner* — Mesfin T Asfaw
(74) *Attorney, Agent, or Firm* — Sterne, Kessler, Goldstein & Fox P.L.L.C.

(57) ABSTRACT

An apparatus and method for detecting extreme ultraviolet (EUV) radiation is disclosed. The apparatus includes a detector having a top surface, a layer of scintillation material on the top surface of the detector, a layer of spacer material on the layer of scintillation material, and a spectral purity filter layer on the layer of spacer material. The method includes directing the EUV radiation through the spectral purity filter layer and through the spacer material layer. The spacer material layer may be disposed between the spectral purity filter layer and a layer of scintillation material. The method further includes detecting scintillation radiation emitted by the scintillation material using the detector.

14 Claims, 3 Drawing Sheets

(56) References Cited

U.S. PATENT DOCUMENTS

| | | |
|---|---|---|
| 7,329,876 B2 | 2/2008 | Schuermann et al. |
| 7,561,251 B2 | 7/2009 | Van Der Feltz et al. |
| 7,772,558 B1 * | 8/2010 | Nagarkar et al. ......... 250/361 R |
| 2002/0037461 A1 | 3/2002 | Van Der Werf et al. |
| 2002/0096728 A1 * | 7/2002 | Kuhlmann .................... 257/432 |
| 2004/0061930 A1 | 4/2004 | Wedowski |
| 2004/0114120 A1 | 6/2004 | Van De Kerhof et al. |
| 2009/0015814 A1 | 1/2009 | Mueller |

* cited by examiner

LITHOGRAPHIC APPARATUS AND DETECTOR APPARATUS

CROSS-REFERENCE TO RELATED APPLICATIONS

This application claims the benefit of U.S. provisional application 61/172,904 which was filed on 27 Apr. 2009, and which is incorporated herein in its entirety by reference.

FIELD

The present invention relates to a lithographic apparatus and to a detector apparatus which may form part of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Imaging of the pattern onto the substrate is performed by a projection system, which may comprise a plurality of lenses or mirrors.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \lambda / NA_{PS} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of k1.

In order to shorten the exposure wavelength and, thus, reduce the minimum printable size, it has been proposed to use an extreme ultraviolet (EUV) radiation source in a lithographic apparatus. EUV radiation sources are configured to output a radiation wavelength of around 13.5 nm. Thus, EUV radiation sources may constitute a significant step toward achieving printing of small features.

It is conventional to monitor the optical performance of parts of a lithographic apparatus in order to ensure that the accuracy with which patterns are projected onto substrates remains high. For example, an imaging detector may be located in a substrate table of the lithographic apparatus, and may be used to monitor aberrations present in a projection system of the lithographic apparatus. In a conventional (non-EUV) lithographic apparatus, the imaging detector may comprise a CCD array that has been provided with a layer of a scintillation material, e.g., $Gd_2O_2S:Tb$ (known as P43). The scintillation material converts radiation at, for example, about 248 nm or 193 nm into visible radiation at, for example, about 550 nm (or some other suitable wavelength). The visible radiation is then detected by the CCD array.

While it is possible to detect EUV radiation in the same way (using a CCD array provided with a scintillation material layer), the efficiency and/or accuracy with which the EUV is detected may be poor.

SUMMARY

It is desirable to provide a detector apparatus capable of detecting EUV radiation with improved efficiency and/or accuracy compared with at least some previous detectors.

According to first embodiment of the present invention. there is provided a detector apparatus comprising a detector provided with a layer of scintillation material, a layer of spacer material provided on the scintillation material, and a spectral purity filter layer provided on the spacer material.

According to a second embodiment of the present invention there is provided a detection method comprising directing EUV radiation through a spectral purity filter layer, through a spacer material layer provided beneath the spectral purity filter layer, and onto a layer of scintillation material, then using a detector to detect scintillation radiation emitted by the scintillation material.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus, according to an embodiment of the invention.

Figure 1:
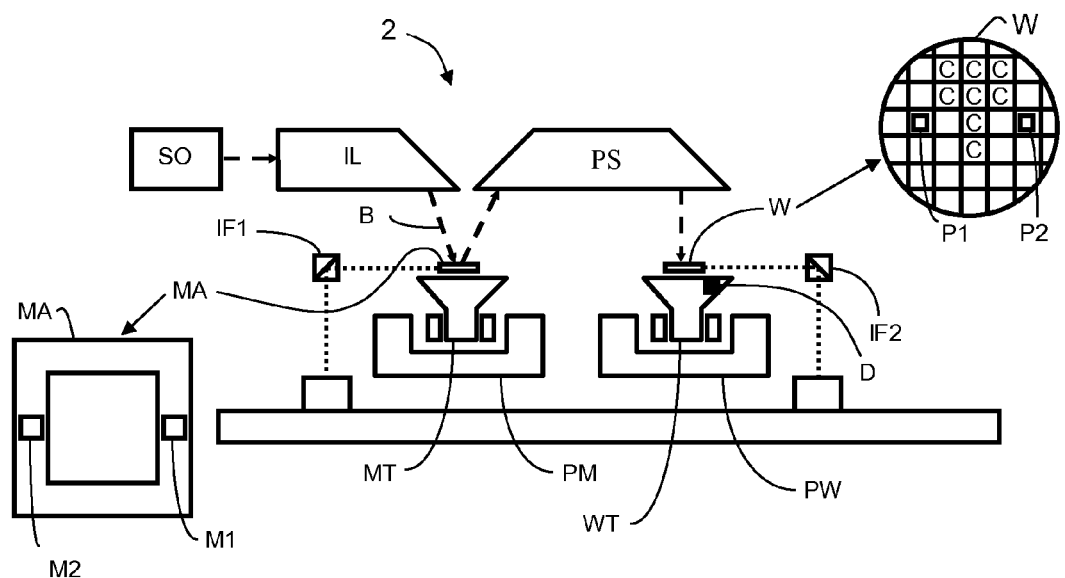

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structur-

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus 2 which embodies the invention. The apparatus 2 comprises an illumination system (illuminator) IL configured to condition a radiation beam B (e.g., extreme ultraviolet (EUV) radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a reflective projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation. In most EUV lithographic apparatus, the illumination system is predominantly formed from reflective optical components.

The support structure supports, i.e., bears the weight of, the patterning device. It holds the patterning device in a manner that depends on the orientation of the patterning device, the design of the lithographic apparatus 2, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically, in an EUV lithographic apparatus, would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in a EUV lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus 2 is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation emission point by means of the collector assembly/radiation source SO. The source and the lithographic apparatus may be separate entities. In such cases, the collector assembly is not considered to form part of the lithographic apparatus and the radiation beam is passed from the collector assembly SO to the illuminator IL with the aid of a beam delivery system comprising, for example, suitable directing mirrors and/or a beam expander. In other cases the source may be an integral part of the lithographic apparatus. The collector assembly SO including the radiation generator and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW, and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A detector apparatus D according to an embodiment of the invention, is provided in the substrate table WT. The detector apparatus is described further below.

The depicted apparatus 2 could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the plane of the substrate so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
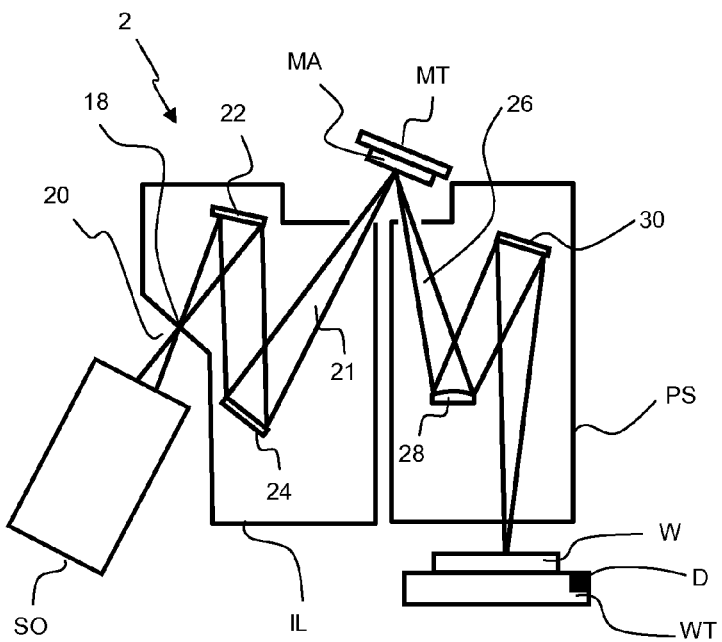
FIG. 2 is a more detailed schematic illustration of the lithographic apparatus of FIG. 1.

FIG. 2 shows an embodiment of the lithographic apparatus 2 of FIG. 1 in more detail, but still in schematic form, including a collector assembly/radiation source SO, an illuminator IL (sometimes referred to as an illumination system), and the projection system PS.

The source SO comprises a radiation generator and a collector assembly which focuses radiation into a virtual source point collection focus 18 at an entrance aperture 20 in the illuminator IL. A beam of radiation 21 is reflected in the illuminator IL via first and second reflectors 22, 24 onto a reticle or mask MA positioned on reticle or mask table MT. A patterned beam of radiation 26 is formed which is imaged in projection system PS via first and second reflective elements 28, 30 onto a substrate W held on a substrate table WT.

A detector apparatus D according to an embodiment of the invention is provided in the substrate table WT. The detector apparatus D may comprise an imaging detector used to monitor aberrations present in the projection system PS. Monitoring for aberrations may be achieved for example by providing a grating above the detector apparatus D, providing an equivalent grating on the reticle MA, and then monitoring an image detected by the detector apparatus at different positions of the substrate table WT.

It will be appreciated that more or fewer elements than shown in FIG. 2 may generally be present in the collector assembly/radiation source SO, illumination system IL, and projection system PS. For instance, in some embodiments the lithographic apparatus 2 may also comprise one or more transmissive or reflective spectral purity filters. More or less reflective elements may be present in the lithographic apparatus.

Figure 3:
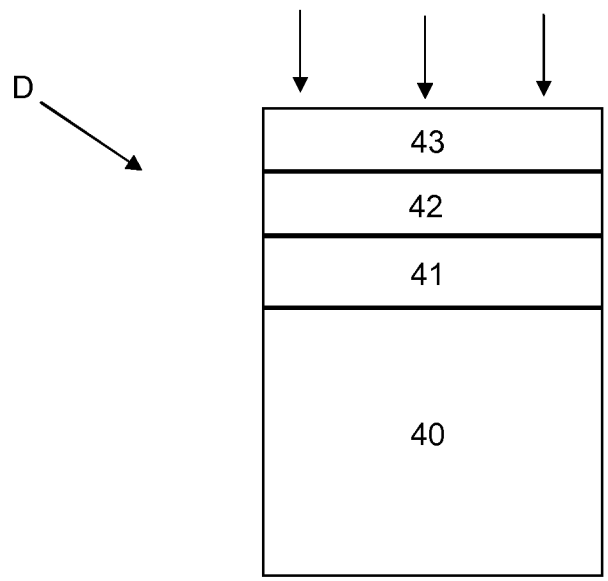
FIGS. 3 and 5 show schematic cross-sectional views of detector apparatus according to embodiments of the invention.

FIG. 3 shows schematically in cross section the detector apparatus D, according to an embodiment of the present invention. The detector apparatus D comprises an imaging detector 40, a layer of scintillation material 41, a spacer material layer 42 and a spectral purity filter layer 43. The scintillation layer 41 is provided on top of the imaging detector 40, the spacer material layer 42 is provided on top of the scintillation layer, and the spectral purity filter layer 43 is provided on top of the spacer material layer 42.

The imaging detector 40 may for example be a CCD array. The CCD array may have a detection surface which measures 12 mm×12 mm. The scintillation material 41 may for example be $Gd_2O_2S:Tb$ (known as P43 and available for example from Applied Scintillation Technologies of Harlow, United Kingdom, or from Proxitronic Imaging GmbH of Bensheim, Germany). The layer of scintillation material may for example be about 10 μm thick. The spacer material 42 may for example be silicon nitride (SiN, non-stoichiometric). The thickness of the spacer material is discussed further below. The spectral purity filter layer 43 may for example be a zirconium layer. The zirconium layer may be sufficiently thick that it provides effective filtering of deep ultraviolet (DUV) and visible radiation, but may be sufficiently thin that it does not absorb too much extreme ultraviolet radiation (EUV). The zirconium layer may for example be about 50 nm thick.

An additional layer (not pictured) may be provided between the P43 layer 41 and the CCD array 40. The additional layer, which may be glass, may facilitate connection of the P43 layer 41 to the CCD array 40 (it may be difficult to directly bond the P43 layer 41 onto the CCD array 40). Glue may be provided between the CCD array 40 and the additional layer, and may be provided between the additional layer and the P43 layer 41. The additional layer may for example be a so called faceplate formed from Schott Standard 47A glass with EMA, available from Schott AG of Mainz, Germany.

FIG. 3 shows radiation being incident upon the zirconium layer 43. In addition to extreme ultraviolet (EUV) radiation, deep ultraviolet (DUV) and visible radiation are also incident upon the zirconium layer. This is because the source SO (see FIGS. 1 and 2), which is used to generate the EUV radiation, may generate radiation over a wide range of wavelengths, including EUV, DUV and visible. The amount of DUV and visible radiation generated by the source SO may be greater than the amount of EUV radiation generated by the source. Therefore, substantial amounts of DUV and visible radiation may be incident upon the detector apparatus D in addition to EUV radiation.

It is desirable to filter out non-EUV radiation, such as DUV and visible radiation, before detection by the CCD array 40. This helps to ensure that the image detected by the CCD array is an image of the EUV radiation that has passed through the projection system PS, and not radiation of other wavelengths, which has passed through the projection system. Projection system aberrations may affect EUV and non-EUV radiation differently. Since it is EUV radiation, which will be used to project a pattern onto the substrate during operation of the lithographic apparatus, it is desirable to detect the effect of the projection system aberrations on the EUV radiation only. In other words, the optical properties of the projection system may be different for EUV radiation and for non-EUV radiation, and it is desirable to detect those properties for EUV radiation only.

The zirconium layer 43 filters out most of the DUV and visible radiation, allowing predominantly EUV radiation to pass to the silicon nitride layer 42. The filtering ratio provided by the zirconium layer 43 will depend upon its thickness. For example, an about 50 nm layer of zirconium may provide a filtering ratio of 1 (EUV):0.2 (DUV):0.1 (visible), and an about 100 nm layer of zirconium may provide a filtering ratio of 1 (EUV):0.04 (DUV):0.02 (visible). In other words, the amount of EUV radiation that is transmitted by the filter may for example be 5 to 20 times greater than the amount of DUV and visible radiation that is transmitted by the filter (assuming that equal amounts of EUV, DUV and visible radiation are incident upon the filter).

Following transmission by the zirconium layer 43, the EUV radiation passes into the silicon nitride layer 42. The EUV radiation suffers some absorption as it passes through the silicon nitride layer 42 (e.g., around 20%), but is otherwise unchanged. The EUV radiation is then incident upon the P43 layer 41.

The P43 layer 41 converts photons of the EUV radiation, via scintillation, into photons at a visible wavelength, such as about 550 nm. The 550 nm photons are then detected by the CCD array 40. In this way, the CCD array 40 provides imaging detection of the EUV radiation. This allows the CCD array to be used to monitor the effect of aberrations in the projection system PS on EUV radiation which passes through the projection system.

The presence of the silicon nitride layer 42 between the zirconium layer 43 and the P43 layer 41 improves the efficiency of the conversion of EUV photons to about 550 nm photons (compared with the conversion efficiency that would be seen if the zirconium layer 43 were to be provided directly on top of the P43 layer 41). If the zirconium layer 43 were to be provided directly on top of the P43 layer, then this would lead to substantial quenching of the P43 scintillation, which would lead to a marked reduction of the number of photons converted from EUV to about 550 nm.

As is explained further below, EUV radiation is strongly absorbed by P43. This strong absorption of the EUV radiation is typical for most materials, including the known EUV scintillators. This means that the majority of conversion of EUV photons into 550 nm photons occurs in the first 50 nm (approximately) of the P43 layer. Consequently, if a zirconium layer 43 were to be provided directly on top of the P43 layer, then the majority of photon conversions would take place within about 50 nm of the zirconium layer. However, photon conversions, which take place close to the zirconium layer are quenched by the zirconium. The quenching arises from the energy of excited atoms in the P43 being non-radiatively transferred to the zirconium layer and then dissipating within the zirconium. Thus, providing the zirconium directly on top of the P43 causes the number of photons converted from EUV to 550 nm to be reduced substantially.

In this example, providing the silicon nitride layer 42 between the P43 layer 41 and the zirconium layer 43, separates the P43 from the zirconium, and thereby provides a substantial reduction of the scintillation quenching caused by the zirconium.

In one example, identifying that quenching takes place at the surface of the P43 due to the presence of zirconium, and preventing that quenching by providing a layer of silicon nitride between the P43 and the zirconium, provides a substantial advance.

In one example, using the layer of silicon nitride to separate the zirconium from the P43 is advantageous compared with, for example, leaving empty space between the zirconium and the P43, since it prevents contamination from building up between the zirconium and the P43. If an empty space were to be provided, then it would be difficult to prevent contamination from accumulating in that space. For example, carbon might grow on surfaces which surround the space. In addition, it would be difficult to remove the contamination once it had accumulated. In particular, the zirconium layer would be thin and would be susceptible to damage during cleaning.

In one example, if a sealed space were to be provided between the zirconium and the P43, problems would be likely to arise from pressure changes during evacuation of gas from the lithographic apparatus (a vacuum is established in the lithographic apparatus before it is used for lithography). In particular, the zirconium layer would be likely to rupture.

Figure 4A:
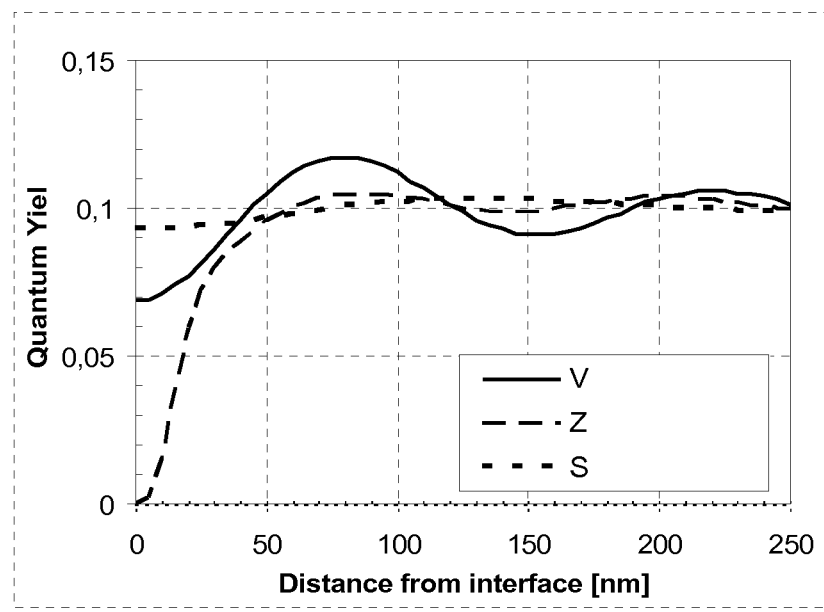
FIGS. 4a-4b illustrates with graphs the emission quantum yield of a scintillator material as a function of distance from a top surface or interface with a spectral purity filter, the absorption of EUV radiation by the scintillator material, and the absorption of EUV radiation by silicon nitride.

FIG. 4a is a graph which shows, based on theoretical calculations, the effect on the emission quantum yield of scintillator atoms of the P43 layer, which arises from providing different materials at an outer surface of the P43 layer, according to an embodiment of the present invention. The graph shows the quantum yield of the P43 as a function of distance (in nm) from the outer surface of the P43 (the outer surface is referred to in the graph as the interface). In the calculations used for the examples shown in FIG. 4a, quantum yield variations were calculated assuming that the quantum yield of the P43 away from the outer surface of the P43 is about 10%.

Although this value was chosen for the calculations, the invention may be used for other values of the quantum yield. It was also assumed that the orientations of transition dipole moments of the scintillator atoms in the P43 were randomly distributed. The quenching mentioned further above was taken into account when calculating the quantum yield of the P43 in the presence of zirconium.

In a first example, represented by a solid line V, there is no material at the surface of the P43, merely a vacuum. As can be seen from FIG. 4a, the quantum yield at the surface (interface) of the P43 is suppressed to a limited degree (around 30% of the value in the bulk of P43), and then rises to a peak around 80 nm from the surface. The quantum yield appears to oscillate with a period of roughly 150 nanometers, the magnitude of the oscillation decreasing with distance from the surface.

In a second example, represented by a dashed line Z, a layer of zirconium is provided at the surface of the P43. The presence of the zirconium causes the quantum yield to drop to zero at the surface of the P43. It is believed that the emission quenching occurs due to the fact that the zirconium is a metal, and thus has free electrons that can absorb the energy of excited scintillator atoms. The quantum yield climbs gradually to a steady value within around 75 nm of the interface. However, as is described below in relation to FIG. 4b, the majority of the EUV radiation which is incident upon the P43 will be absorbed within the first about 50 nm of the P43. Therefore, the poor quantum yield in the first about 50 nm of the P43 (in the presence of zirconium) causes a substantial reduction in the performance of the P43.

In a third example, represented by a dotted line S, a layer of silicon nitride is provided at the surface of the P43. The presence of the silicon nitride gives rise to a high quantum yield at the surface of the P43. The quantum yield remains high, and climbs slightly as the distance from the surface increases. Providing the silicon nitride at the P43 surface thus provides good quantum yield in the P43 at locations close to the surface of the P43. Indeed, it can be seen that the quantum yield within the first 30 nm or so of the P43 is higher when the silicon nitride is present than when the P43 is in a vacuum.

Figure 4B:
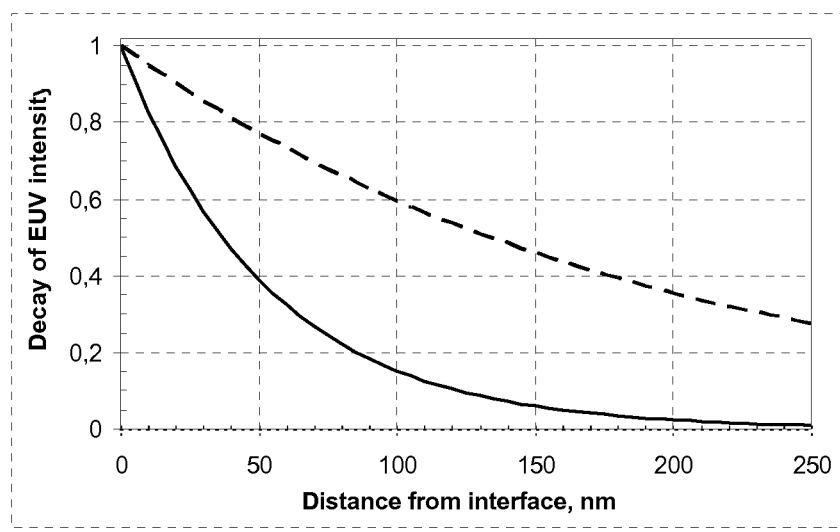

FIG. 4b is a graph which shows the decay of normalized EUV radiation intensity as a function of distance, measured in nm, inside P43 (shown as a solid line). The intensity of the EUV radiation in the P43 can be seen to drop off very rapidly, with around 60% of the intensity being lost within the first about 50 mn of the P43 material. This strong absorption of EUV in P43 is the reason why the majority of scintillations caused by EUV occur in the first 50 nm of the P43.

The decay of normalized EUV radiation intensity as a function of distance, measured in nm, inside silicon nitride is shown in FIG. 4b as a dashed line. The intensity of EUV radiation in the silicon nitride reduces relatively slowly, in a nearly linear manner over distances of interest (e.g., 0-100 nm). This relatively low absorption of EUV by silicon nitride is a reason why this material is used in the above described embodiment of the invention.

FIGS. 4a and 4b may be used to selected an appropriate thickness for the silicon nitride layer 42 of the detector apparatus D. A thicker silicon nitride layer 42 provides stronger separation of the P43 layer 41 from the zirconium layer 43, and reduces the quenching effect of the zirconium. However, a thinner silicon nitride layer 42 absorbs less EUV, thus allowing more EUV to be incident upon the P43. A balance may be struck between these two requirements. In embodiments in which a spacer layer 42 is formed from a material other than silicon nitride, an appropriate thickness for the material may be selected in a similar manner.

Referring to FIG. 4a, separating the zirconium from the P43 by about 50 nm will provide a recovery of the quantum yield (back to more than about 90% of the bulk quantum yield). Referring to FIG. 4b, using about 50 nm of silicon nitride to provide that separation will reduce the intensity of the EUV radiation incident upon the P43 by around 25%.

Any other thickness of silicon nitride layer 42 may be used, for example by selecting an appropriate thickness with reference to FIGS. 4a and 4b. For example, the silicon nitride layer 42 may be between about 50 and 100 nm thick.

As mentioned further above, the silicon nitride layer 42 is transparent to visible radiation. Since the P43 layer emits photons in the visible spectrum (e.g. at 550 nm), scintillation photons which are emitted by the P43 layer may travel through the silicon nitride layer 42 without suffering significant absorption. Consequently, a portion of scintillation photons which are emitted by the P43 layer 41 away from the CCD array 40 will be reflected back towards the CCD array by the zirconium layer 43, and will therefore be incident upon the CCD array. This will increase the intensity of radiation which is incident upon the CCD array 40.

Figure 5:
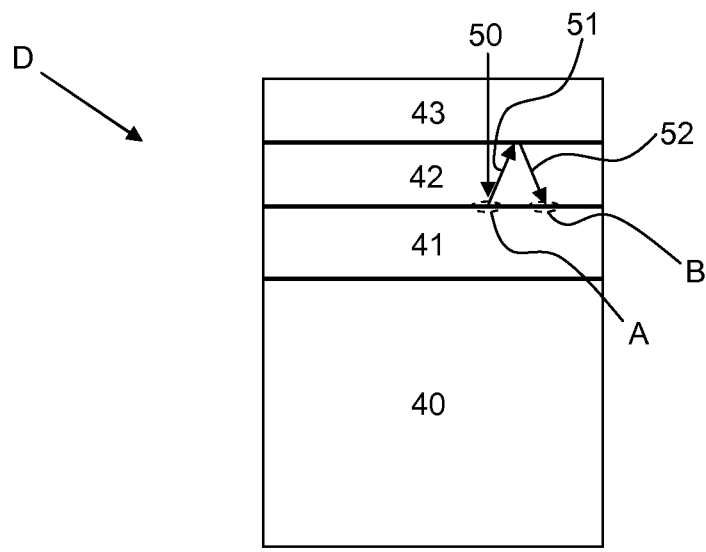

Although increasing the intensity of radiation incident upon the CCD array 40 might be considered to be advantageous, the contrast of the image seen by the CCD array may be reduced. This is because the image may be blurred by radiation arriving back at the P43 layer 41 at a location which differs from the location from which the radiation was emitted. Referring to FIG. 5, EUV radiation 50 is incident at a location A on the P43 layer 41. Radiation 51 is emitted from location A on the P43 layer 41 and travels upwards at an angle through the silicon nitride layer 42 and towards the zirconium layer 43. The zirconium layer 43 reflects the radiation 52, which travels downwards at an angle towards location B on the P43 layer 41. Location B is some distance away from location A. In an image detected by the CCD array 40 it appears that EUV radiation has been incident at location B on the P43 layer 41. Radiation which is reflected via the zirconium layer in the manner shown in FIG. 5 thus blurs the image detected by the CCD array 40.

A spacer layer material which may be used instead of silicon nitride, and which does not suffer from the above disadvantage, is silicon. Silicon is substantially transparent to EUV radiation, but absorbs radiation in the visible spectrum. Thus, referring again to FIG. 5, the radiation 51 which is emitted from location A on the P43 layer 41 is absorbed by the silicon layer 42, and is not reflected back to the P43 layer at location B (or is reflected back at a significantly lower intensity). Since the radiation 51 is absorbed, blurring of the image due to reflected radiation is avoided (or is reduced).

When silicon is used as the spacer material layer 42 rather than silicon nitride, the total intensity of radiation received at the CCD array 40 is reduced. It might be considered counter intuitive to reduce the intensity of radiation received at the CCD array 40. However, for the reasons explained above, an improvement of the quality of the image seen at the CCD array may be provided. This improvement of image quality may be more beneficial than the loss of intensity of radiation, such that a net benefit arises from the use of silicon as the spacer material layer 42 rather than silicon nitride.

The silicon layer 42 preferentially absorbs radiation which is emitted from the P43 layer 41 at shallow angles, compared to for example radiation which is emitted perpendicularly from the P43 layer. In this context, the term 'shallow angles' is intended to refer to angles which are measured relative to the plane of the interface between the P43 layer 41 and the silicon layer 42. This is because the distance which is travelled by radiation emitted at shallow angles is significantly longer than the distance which is travelled by the radiation emitted perpendicularly. Since the radiation travels a longer distance through the silicon layer 42, it will be absorbed more completely by the silicon layer than radiation which is emitted perpendicularly from the P43 layer. Thus, the silicon layer 42 naturally suppresses radiation which strays furthest from a point of origin on the P43 layer 41, thereby improving the contrast of the image seen by the CCD array 40.

A further advantage of forming the spacer material layer 42 from silicon is that the relatively high refractive index of silicon (n=5.2), compared with the refractive index of silicon nitride (n=2.1), is such that visible radiation emitted from the P43 layer 41 at shallower angles will travel into the silicon spacer layer and will be absorbed.

A further advantage of the use of silicon as the spacer layer material 42 is that it is highly absorbing of DUV radiation. The zirconium layer 43 and the silicon layer 42 thus act as a combined filter which transmits EUV and filters out other wavelengths with an efficiency which may be greater than that which would be achieved using zirconium only or silicon only.

Although the above described example refers to the use of silicon as the spacer layer material, other materials with similar properties may be used. The spacer layer may for example be formed from other materials which absorb visible radiation and which are substantially transparent to EUV radiation.

Silicon nitride and silicon may be considered to be examples of spacer materials. The spacer material may be any suitable material. A spacer material may be selected which does not significantly quench the emission of the photons by the scintillator material. A spacer material may be selected which provides a degree of transparency to EUV radiation (e.g., which transmits a substantial portion of incident EUV radiation).

The degree to which the spacer material absorbs EUV radiation may be a relevant consideration. The spacer material may for example absorb less than about 50% of EUV radiation within about 50 nm of the material, less than about 40% of EUV radiation within about 50 nm of the material, and may absorb less than about 25% of EUV radiation within about 50 nm of the material.

The absorption of EUV radiation in a given material may be expressed as an attenuation length (the length taken for the intensity to drop by a factor of 1/exp). Silicon nitride (SiN, non-stoichiometric) has an attenuation length of about 193 nm. Another possible spacer material is silicon dioxide (SiO2), which has an attenuation length of about 135 nm. Silicon nitride provides the advantage that it has a low EUV absorbance (compared with some other commercially available optically transparent inorganic materials).

The spacer material may for example be an organic material which has low density and which is stable in the presence of EUV radiation. The spacer material may for example be polypropylene (attenuation length is about 400 nm), Parylene-N,C (attenuation length is about 320 nm, 300 nm), polycarbonate (attenuation length is about 220 nm) or PMMA (attenuation length is about 190 nm), provided that these materials exhibit sufficient stability in the presence of EUV radiation.

The above attenuation lengths are based on theoretical predictions from a website of the Lawrence Berkeley National Laboratory (http://henke.lbl.gov/optical_constants).

P43 may be considered to be one example of a scintillator material. The scintillator may however be any suitable material. For example, the scintillator may be YAG:Ce, or any other scintillator which converts EUV to radiation at a more easily detectable wavelength (e.g., a visible wavelength).

Zirconium may be considered to be one example of a spectral purity filter (i.e., a filter which filters out unwanted wavelengths). The spectral purity filter may however be any suitable material. For example, the spectral purity filter may be a metal. The metal may for example be a pure metal, or a composite such as zirconium with silicon and or nitrides. The spectral purity filter may comprise layers of different materials.

It is not essential that the detector 40 is a CCD array. The detector may be any detector which detects photons converted by the scintillator. The detector may for example be an imaging detector, for example a micro-array of photomultiplier tubes. The detector may for example be a non-imaging detector, for example a photodiode.

In the above description, the term EUV is intended to refer to extreme ultraviolet radiation. Although extreme ultraviolet radiation in a lithographic apparatus is often centered around 13.5 nm, the term extreme ultraviolet radiation may encompass other wavelengths (e.g., wavelengths in the range 5-20 nm).

Although specific reference may be made in this text to the use of lithographic apparatus in the manufacture of integrated circuits, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A detector apparatus comprising:
   a detector having a top surface;
   a layer of scintillation material disposed on the top surface of the detector;
   a layer of spacer material disposed on the layer of scintillation material; and
   a spectral purity filter layer disposed on the layer of spacer material.

2. The apparatus of claim 1, wherein the layer of spacer material is less than 100 nm thick.

3. The apparatus of claim 1, the layer of spacer material layer is at least 50 nm thick.

4. The apparatus of claim 1, wherein the layer of spacer material absorbs less than 50% of extreme ultraviolet (EUV) radiation within 50 nm of the layer of spacer material.

5. The apparatus of claim 1, wherein the layer of spacer material absorbs less than 50% of EUV radiation within 100 nm of the layer of spacer material.

6. The apparatus of claim 1, wherein the layer of spacer material is substantially transparent at a wavelength of scintillation emission of the layer of scintillation material.

7. The apparatus of claim 1, wherein the layer of spacer material comprises silicon, silicon nitride, or silicon dioxide.

8. The apparatus of claim 1, wherein the spectral purity filter layer comprises zirconium or chromium.

9. The apparatus of claim 1, wherein the layer of scintillation material comprises $Gd_2O_2S$:Tb or YAG:Ce.

10. The apparatus of claim 1, wherein the detector is an imaging detector.

11. The apparatus of claim 10, wherein the imaging detector is a CCD array.

12. A lithographic apparatus comprising:
    a substrate table configured to hold a substrate;
    a projection system configured to project a patterned radiation beam onto a target portion of the substrate; and
    a detector apparatus configured to detect at least a portion of the patterned radiation beam, wherein the detector apparatus comprises:
    a detector having a top surface;
    a layer of scintillation material disposed on the top surface of the detector;
    a layer of spacer material disposed on the layer of scintillation material; and
    a spectral purity filter layer disposed on the layer of spacer material.

13. The lithographic apparatus of claim 12, wherein the detector apparatus is provided in the substrate table of the lithographic apparatus.

14. A detection method comprising;
    directing extreme ultraviolet (EUV) radiation through a spectral purity filter layer and through a spacer material layer, the spacer material layer being disposed between the spectral purity filter layer and a layer of scintillation material, the layer of scintillation material being disposed on a to surface of a detector; and
    detecting scintillation radiation emitted by the layer of scintillation material using the detector.

* * * * *

UNITED STATES PATENT AND TRADEMARK OFFICE
CERTIFICATE OF CORRECTION

PATENT NO. : 8,934,083 B2
APPLICATION NO. : 13/260009
DATED : January 13, 2015
INVENTOR(S) : Nikolaev et al.

It is certified that error appears in the above-identified patent and that said Letters Patent is hereby corrected as shown below:

In the Claims

In col. 13, line 12, claim 3 after "claim 1,", please insert --wherein--.
In col. 14, line 10, claim 12 after "surface", please delete ":" and insert --;--.
In col. 14, line 27, claim 14 after "on a", please delete "to" and insert --top--.

Signed and Sealed this
Eighth Day of September, 2015

Michelle K. Lee
*Director of the United States Patent and Trademark Office*